(12) United States Patent
Rad et al.

(10) Patent No.: US 8,380,003 B2
(45) Date of Patent: Feb. 19, 2013

(54) IMAGE RECONSTRUCTION WITH INCOMPLETE FOURIER-SPACE MAGNITUDE DATA COMBINED WITH REAL-SPACE INFORMATION

(75) Inventors: Leili Baghaei Rad, Stanford, CA (US); Ian George Downes, Stanford, CA (US)

(73) Assignee: The Board of Trustees of the Lenard Stanford Junior University, Palo Alto, CA (US)

( * ) Notice: Subject to any disclaimer, the term of this patent is extended or adjusted under 35 U.S.C. 154(b) by 639 days.

(21) Appl. No.: 12/454,579

(22) Filed: May 19, 2009

(65) Prior Publication Data

US 2009/0297018 A1    Dec. 3, 2009

Related U.S. Application Data

(63) Continuation-in-part of application No. 12/291,248, filed on Nov. 6, 2008, now abandoned.

(60) Provisional application No. 61/002,306, filed on Nov. 7, 2007.

(51) Int. Cl.
*G06K 9/36* (2006.01)

(52) U.S. Cl. ........ 382/276; 382/144; 382/232; 382/240; 382/302

(58) Field of Classification Search .................. None
See application file for complete search history.

(56) References Cited

U.S. PATENT DOCUMENTS

| | | | | |
|---|---|---|---|---|
| 3,879,131 A | * | 4/1975 | Cuthbert et al. | 356/521 |
| 5,848,193 A | * | 12/1998 | Garcia | 382/232 |
| 5,896,176 A | * | 4/1999 | Das et al. | 375/240.15 |
| 6,058,214 A | * | 5/2000 | Bottou et al. | 382/240 |
| 6,343,154 B1 | * | 1/2002 | Bottou et al. | 382/240 |
| 7,286,711 B2 | * | 10/2007 | Bottou et al. | 382/240 |
| 7,450,772 B2 | * | 11/2008 | Bottou et al. | 382/240 |
| 2003/0053717 A1 | * | 3/2003 | Akhan et al. | 382/302 |
| 2005/0074092 A1 | * | 4/2005 | Borgstahl et al. | 378/98.8 |
| 2006/0034525 A1 | * | 2/2006 | Sakai | 382/232 |
| 2006/0147097 A1 | | 7/2006 | Grangeat et al. | |
| 2007/0286509 A1 | * | 12/2007 | Bottou et al. | 382/240 |
| 2008/0050007 A1 | * | 2/2008 | Oaki | 382/144 |
| 2008/0050008 A1 | * | 2/2008 | Oaki | 382/144 |
| 2009/0228408 A1 | * | 9/2009 | Kaushal et al. | 706/12 |
| 2010/0212909 A1 | * | 8/2010 | Baumstein et al. | 166/369 |

OTHER PUBLICATIONS

Elser et al., "Searching with iterated maps", 2007, pp. 418-423, PNAS v104 n2.
Chen et al., "Image reconstruction based on combination of wavelet decomposition, inpainting and texture synthesis", 2006, WSGC'2006.
Robinson et al., "Three-dimensional coherent X-ray diffraction microscopy", 2004, pp. 177-181, MRS Bulletin Mar. 2004.
Miao et al., "High resolution 3D X-ray diffraction microscopy", 2002, pp. 088303-1-088303-4, Physical Review Letters v89n8.

* cited by examiner

*Primary Examiner* — Tsung-Yin Tsai
(74) *Attorney, Agent, or Firm* — Lumen Patent Firm

(57) ABSTRACT

Image reconstruction is based on phase retrieval by combining incomplete Fourier-space magnitude data with real-space information. Phase retrieval is performed based on the Fourier-space magnitude data, where the real-space information is expressed in a form suitable to use as a phase retrieval constraint, preferably using a wavelet-space representation. The use of incomplete Fourier-space magnitude data advantageously reduces the amount of data required compared to approaches that need comprehensive Fourier-space magnitude data. The real space information can be regarded as partial information of the image being reconstructed. Depending on the application, more or less real space information may be available.

8 Claims, 4 Drawing Sheets

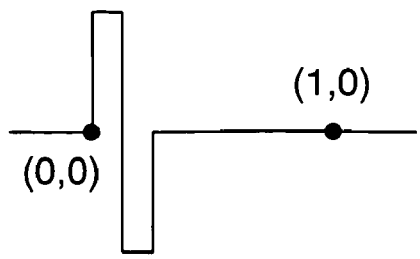
Fig. 2d
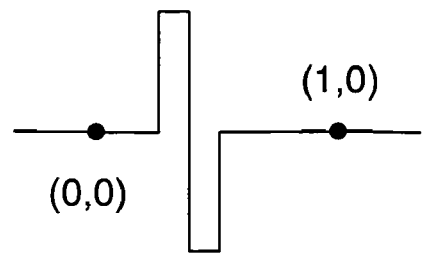
Fig. 2e
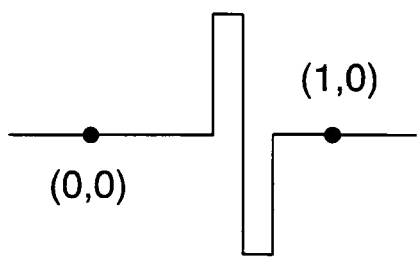
Fig. 2f
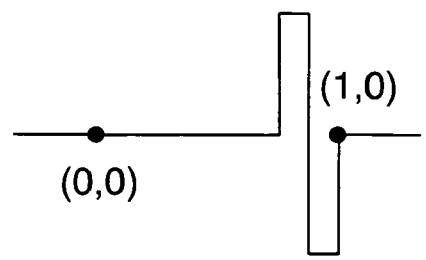
Fig. 2g
| -1 | -1 | -1 | -1 |
|----|----|----|----|
| -1 | -1 | -1 | -1 |
| 1  | 1  | 1  | 1  |
| 1  | 1  | 1  | 1  |
Fig. 3a
| 1 | 1 | -1 | -1 |
|---|---|----|----|
| 1 | 1 | -1 | -1 |
| 1 | 1 | -1 | -1 |
| 1 | 1 | -1 | -1 |
Fig. 3b
| -1 | -1 | 1  | 1  |
|----|----|----|----|
| -1 | -1 | 1  | 1  |
| 1  | 1  | -1 | -1 |
| 1  | 1  | -1 | -1 |
Fig. 3c
| -1 | -1 | -1 | -1 |
|----|----|----|----|
| 1  | 1  | 1  | 1  |
| 0  | 0  | 0  | 0  |
| 0  | 0  | 0  | 0  |
Fig. 3d
| 1 | -1 | 0 | 0 |
|---|----|---|---|
| 1 | -1 | 0 | 0 |
| 1 | -1 | 0 | 0 |
| 1 | -1 | 0 | 0 |
Fig. 3e
| -1 | 1  | 0 | 0 |
|----|----|---|---|
| 1  | -1 | 0 | 0 |
| 0  | 0  | 0 | 0 |
| 0  | 0  | 0 | 0 |
Fig. 3f

IMAGE RECONSTRUCTION WITH INCOMPLETE FOURIER-SPACE MAGNITUDE DATA COMBINED WITH REAL-SPACE INFORMATION

CROSS REFERENCE TO RELATED APPLICATIONS

This application is a continuation in part of application Ser. No. 12/291,248, filed Nov. 6, 2008, now abandoned entitled "Rapid Verification of Design Specification in Fabricated Integrated Circuits", and hereby incorporated by reference in its entirety. Application Ser. No. 12/291,248 claims the benefit of U.S. provisional patent application 61/002,306, filed on Nov. 7, 2007, and entitled "Rapid Verification of Design Specification in Fabricated Integrated Circuits". Provisional patent application 61/002,306 is hereby incorporated by reference in its entirety.

GOVERNMENT SPONSORSHIP

This invention was made with US government support under contract number N66001-05-1-8914 awarded by the Navy. The government has certain rights in this invention.

FIELD OF THE INVENTION

This invention relates to image reconstruction.

BACKGROUND

Image reconstruction generally relates to determining an image from input data. In some cases of interest, the input data is Fourier-space information. For example, in coherent X-ray diffraction microscopy, comprehensive X-ray diffraction data (i.e., Fourier-space data) of an object is taken. Computational methods are then employed to determine a real-space image from this diffraction data. However, this determination is not a straightforward Fourier transform of the Fourier-space data, because the X-ray diffraction data provides only the Fourier magnitude. The Fourier phase information is missing from the diffraction data, and must be inferred during the image reconstruction process. This aspect of image reconstruction is known as the phase retrieval problem. The phase retrieval problem is an inverse problem of determining the real-space image that corresponds to given Fourier-space magnitude data.

Phase retrieval methods often rely on additional constraints to expedite processing. For example, the electron density in a crystal is non-negative, so it is appropriate to impose a condition that the real-space image be non-negative when phase retrieval is performed on crystal X-ray diffraction data. As another example, it is often appropriate to specify a real-space domain, within which the real-space image is constrained to lie, as a phase retrieval constraint.

Although image reconstruction employing phase retrieval techniques has been extensively investigated, some practical problems remain. In particular, it can be time consuming to acquire the necessary Fourier magnitude data. Accordingly, it would be an advance in the art to provide a less data-intensive approach for phase retrieval based image reconstruction.

SUMMARY

In the present approach, image reconstruction is based on phase retrieval by combining incomplete Fourier-space magnitude data with real-space information. Phase retrieval is performed based on the Fourier-space magnitude data, where the real-space information is expressed in a form suitable to use as a phase retrieval constraint. The use of incomplete Fourier-space magnitude data advantageously reduces the amount of data required compared to approaches that need comprehensive Fourier-space magnitude data. The real space information can be regarded as partial information of the image being reconstructed. Depending on the application, more or less real space information may be available.

One application of interest is integrated circuit (IC) verification, which is the task of verifying that an integrated circuit as fabricated structurally matches the corresponding integrated circuit design specification. Verification would allow the circuit designer to confirm that the IC as fabricated matches the IC design, which may be of interest in situations where manufacturing is not done under the control of the designer (e.g., in outsourced manufacturing). Functional testing may not suffice to provide such verification, because back-door circuitry could be added in a manner that may not be caught by functional testing.

In this example, one conventional approach to IC verification would be to take comprehensive Fourier-space magnitude data (e.g., obtained from diffraction measurements), and perform a conventional phase retrieval to obtain an image of the fabricated circuit, which could then be compared to the original design specification. However, gathering such comprehensive diffraction data is time consuming, and the resulting method does not take advantage of special features of this problem. These special features include the availability of the original design specification, and the tendency of IC structural features to primarily be orthogonal lines (which tends to concentrate the Fourier-space magnitude data to be on or near Fourier-space axes).

In a preferred embodiment, IC verification is performed by having the incomplete Fourier-space magnitude data be the on-axis Fourier-space magnitudes, and by deriving the real-space information for phase retrieval from the IC design specification. In this manner, the special features of the IC verification problem can be efficiently exploited.

The present approach is also applicable to various other metrology applications, such as inspection and defect detection. More generally, the present approach is applicable in any situation where incomplete Fourier-space magnitude data and some real-space data are available for image reconstruction.

BRIEF DESCRIPTION OF THE DRAWINGS

FIGS. 2a-g show some examples of 1-D Haar basis wavelets.

FIGS. 3a-f show some examples of 2-D Haar basis wavelets.

DETAILED DESCRIPTION

Figure 1:
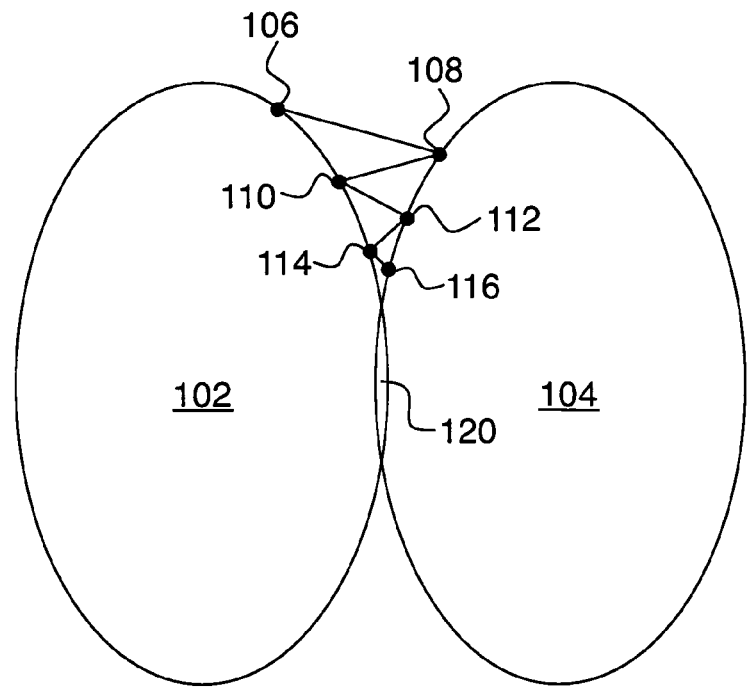
FIG. 1 is a diagram showing a geometric representation of difference map algorithm iterations.

To better appreciate the present approach, it is helpful to consider some aspects of the difference map algorithm, with reference to FIG. 1. To apply the difference map algorithm to a constraint satisfaction problem, several prerequisites must be met. First, the problem to be solved must be expressed as a set intersection problem in Euclidean space (i.e., find a point x that is in set A and also in set B). Second, projection operators $P_A$ and $P_B$ onto sets A and B must be implemented. A projection operator P satisfies the condition P(P(x))=P(x). In some cases, orthogonal projections are employed, and in such cases $P_A$(p) is the point in set A closest to point p, and similarly, $P_B$(p) is the point in B closest to point p. Non-orthogonal projections can also be employed, and can be useful for ensuring satisfaction of constraint(s) (e.g., a positivity constraint). These projection operators are used to define an iterative scheme that converges to a point in the intersection of sets A and B, in favorable cases.

Schematically, the difference map algorithm can proceed as shown on FIG. 1, where 102 is set A, 104 is set B, and a sequence of iterations starts at point 106 and proceeds to points 108, 110, 112, 114, and 116. This sequence of points approaches the set intersection region 120. Various iteration schemes have been employed in connection with the difference map algorithm. One approach maps a point x to a point D(x) given by $$D(x)=x+P_A(2P_B(x)-x)-P_B(x). \quad (1)$$

More generally, the mapping $$x \rightarrow D(x)=x+\beta[P_A(f_B(x))-P_B(f_A(x))]$$

$$f_A(x)=P_A(x)-(P_A(x)-x)/\beta$$

$$f_B(x)=P_B(x)+(P_B(x)-x)/\beta \quad (2)$$

can be employed. Here β is a real parameter that can have either sign. Optimal values for β can be determined by experimentation. Often, setting β to +1 or −1 is preferred, to simplify the iteration. The iteration of Eq. 1 above can be obtained by setting β=1 in Eqs. 2. Progress of the algorithm can be monitored by inspecting the norm of the difference of the two projections, which is given by $$\Delta=|P_A(f_B(x))-P_B(f_A(x))|. \quad (3)$$

As described above, the present approach for image reconstruction relies on incomplete Fourier-space magnitude information combined with real-space information. These constraints on image reconstruction can be expressed in terms compatible with application of the difference map algorithm.

Let set A describe the Fourier magnitude constraint. More specifically, suppose the Fourier magnitudes are specified on a subset S of a domain D. Then, set A is the set of all functions on D that satisfy the magnitude constraint on S. Because S is a subset of D, the Fourier magnitude data is incomplete, in contrast to more conventional phase retrieval situations where complete Fourier magnitude data is employed. For a point p not in A, the projection $P_A$ can be defined as follows: a) Fourier components in D but outside S are unaffected, and b) Fourier components in S are scaled as needed to satisfy the magnitude constraint, without altering their phase.

Similarly the real-space information can be expressed in terms of a set B for the difference map algorithm. A wavelet representation for the real space information has been found to be useful in this situation. Wavelet representations employ wavelet basis functions that provide multiple resolutions in the representation. In general terms, a wavelet representation of an image is a linear superposition of basis functions, referred to as wavelets. For example, a 2-D image I(x,y) can have the following wavelet-space representation $$I(x,y)=\sum_{i,j} a_{i,j} w_{i,j}(x,y). \quad (4)$$

Here, the $w_{i,j}$ functions are the basis wavelets, and the corresponding $a_{i,j}$ are the coefficients of the wavelet-space representation of the image I(x,y). It can be helpful to regard the $a_{i,j}$ as "coordinates" of I(x,y) in the wavelet representation.

FIGS. 2a-g show examples of 1-D basis functions of the Haar wavelets. The Haar wavelets are chosen to provide a simple illustrative example. Any wavelet basis can be employed, including but not limited to: discrete wavelets such as Beylkin wavelets, BNC wavelets, Coiflet wavelets, Cohen-Daubechies-Feauveau wavelets, Daubechies wavelets, Binomial wavelets, Haar wavelets, Mathieu wavelets, Legendre wavelets, Villasenor wavelets, and Symlets; and continuous wavelets such as Beta wavelets, Hermitian wavelets, Hermitian hat wavelets, Mexican hat wavelets, and Shannon wavelets. A wavelet basis typically includes the constant function in addition to the wavelet functions, to improve completeness.

Figure 2A:
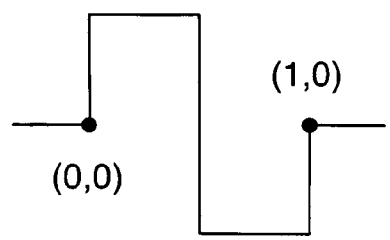
Figure 2B:
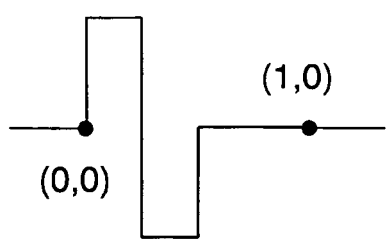
Figure 2C:
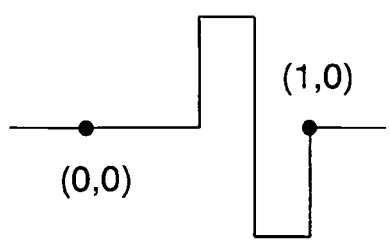

A characteristic feature of wavelet basis functions is that they are scaled and/or shifted versions of an original mother function. In this example, the mother function is shown in FIG. 2a. The functions of FIGS. 2b-c are ½ scale versions of the mother function, and the functions of FIGS. 2d-g are ¼ scale versions of the mother function. The functions of FIGS. 2b-c differ by a ½ step translation, while the functions of FIGS. 2d-g differ by a ¼ step translation. Although the example of FIGS. 2a-g shows 1-D wavelet basis functions, a wavelet representation can have any number of dimensions. In many cases, a separable representation is employed, where higher-dimensional wavelet basis functions are products of the appropriate number of 1-D basis functions.

FIGS. 3a-f show some 2-D Haar wavelet basis functions. These figures are to be understood as top views looking down on the unit square, where the numerical values given in the cells are the values of the basis function in that part of the unit square. Thus, FIG. 3a is the product of a vertical FIG. 2a function and a horizontal constant. Similarly, the function of FIG. 3f is the product of a horizontal FIG. 2b function and a vertical FIG. 2c function.

Figure 4:
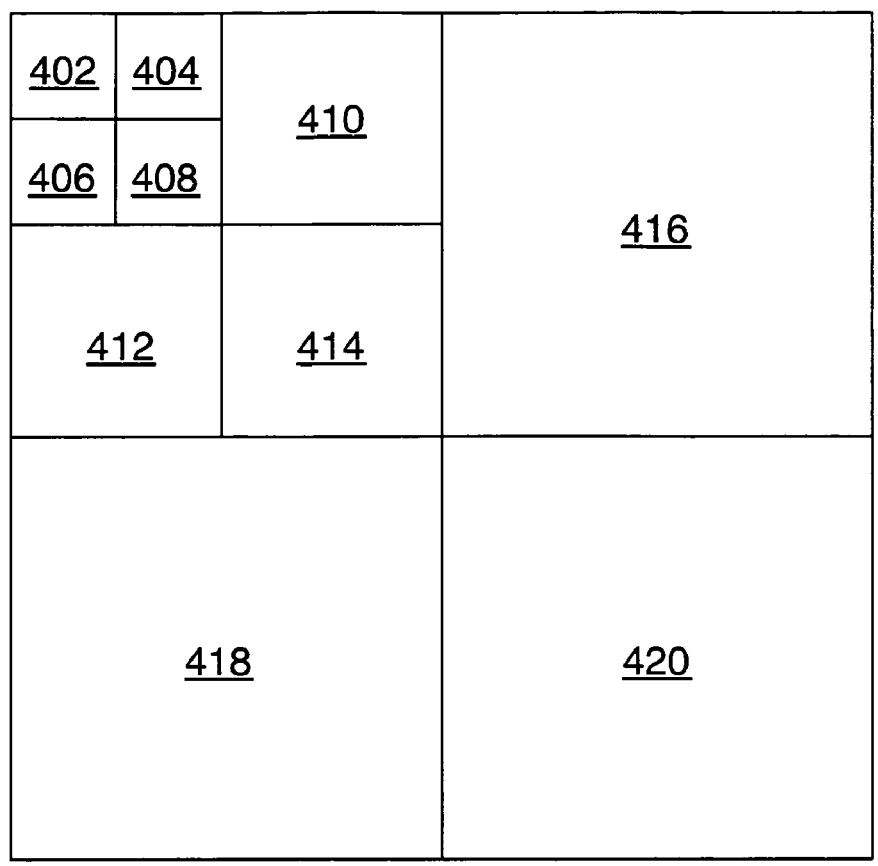
FIG. 4 shows a preferred method of organizing coefficients of a wavelet-space image representation.

It is often convenient to arrange the coefficients of a wavelet representation in a matrix according to the scale of the corresponding wavelets. FIG. 4 shows how this can be done in connection with 2-D wavelets. Generally, wavelet scale decreases as one goes down or to the right in the matrix of FIG. 4. Thus, the coefficient for the 2-D constant function (largest scale) is at location 402 of the matrix. Locations 404, 406, and 408 have the coefficients for the next largest scale functions (functions of FIGS. 3a-c, where the wavelet mother function is added to the basis). Locations 410, 412, and 414 accommodate the coefficients for functions formed by adding the ½ scale functions to the basis. Each of locations 410, 412, and 414 accommodates 4 coefficients, as schematically indicated by the relative areas on FIG. 4. Locations 416, 418 and 420 accommodate the coefficients for functions formed by adding the ¼ scale functions to the basis. Each of locations 416, 418, and 420 accommodates 16 coefficients, as schematically indicated by the relative areas on FIG. 4. This pattern can be extended any number of times in order to provide any degree of spatial resolution that may be needed.

Once a wavelet representation is selected, set B can be defined as the set of all images that satisfy a wavelet-space constraint. For example, wavelet representation coefficients can be specified on a subset S of a domain D, which leads to definitions of set B and projection $P_B$ similar to the definitions of set A and projection $P_A$ above. More specifically, subset S can be a first set of basis wavelets $W_1$, having coefficients $a_1$, and the other wavelets in D can be a second set of basis wavelets $W_2$, having coefficients $a_2$. In this approach, the general representation of Eq. 4 is given by $$I(x, y) = \sum_{w_{i,j} \in W_1} a_{1i,j} w_{i,j}(x, y) + \sum_{w_{i,j} \in W_2} a_{2i,j} w_{i,j}(x, y). \quad (5)$$

We assume that the real-space information is given in the form of real-space data $R(x,y)$. Although $R(x,y)$ may be complete (i.e., specify a value for all x, y in the relevant domain), it is assumed that $R(x,y)$ is not necessarily reliable. For example, in IC verification, $R(x,y)$ can be derived from the IC specifications, but the IC specifications may or may not be consistent with the fabricated IC.

The partitioning of Eq. 5 above can be employed to provide an initial real-space estimate $E_0(x,y)$ as follows. First, the given real-space data is expressed in the wavelet representation of Eq. 5, to give $$R(x, y) = \sum_{w_{i,j} \in W_1} a_1(R)_{i,j} w_{i,j}(x, y) + \sum_{w_{i,j} \in W_2} a_2(R)_{i,j} w_{i,j}(x, y). \quad (6)$$

Here it is convenient to explicitly show the dependence of the coefficients $a_{1i,j}$ and $a_{2i,j}$ on the real-space data R. Second, the initial estimate $E_0$ is computed by setting all of the $a_2$ coefficients to zero, to give $$E_0(x, y) = \sum_{w_{i,j} \in W_1} a_1(R)_{i,j} w_{i,j}(x, y). \quad (7)$$

This estimate can be used as a starting point in a difference map iteration. In this situation, projection onto set B amounts to setting the a, wavelet coefficients of the current estimate equal to the $a_1(R)$ coefficients of Eqs. 6 and 7. Projection onto set B can combine the above-described wavelet-based constraints with other constraints. For example, a constraint of non-negativity can be imposed by setting all negative values in the current estimate to zero. A domain constraint can be imposed by setting all values in an estimate outside the domain to zero. Non-orthogonal projections can be employed to provide a projection to the wavelet constraint space that also satisfies a positivity constraint.

Although these methods can be practiced with any partitioning of the basis wavelets, it is preferred for every basis wavelet in set $W_1$ to have a scale greater than or equal to the scale of any wavelet in set $W_2$. This approach amounts to relying on the large-scale features of given data $R(x,y)$ to be correct, while seeking agreement between the reconstructed image and the Fourier magnitude data by allowing the coefficients of wavelets in set $W_2$ to vary (i.e., the relatively detailed features of $R(x,y)$ are not relied on). For example, referring back to FIG. 4, set $W_1$ could be the wavelets having coefficients in a top-left region of the matrix of FIG. 4.

To summarize these considerations, a method for image reconstruction includes the following:

a) providing a real-space representation R of the image (e.g., $R(x,y)$ above), b) providing substantially incomplete Fourier-space magnitude data of the image (e.g., obtained by measurements of an object), c) computing a wavelet-space representation of R (e.g., as in Eq. 6), d) dividing basis wavelets of the wavelet-space representation into a first set $W_1$ having coefficients a, and a second set $W_2$ having coefficients $a_2$ (e.g., as in Eq. 6), e) computing a wavelet-space representation of an initial estimate (e.g., $E_0$ of Eq. 7), f) iteratively refining the estimate one or more times to provide a final estimate, where coefficients of wavelets in $W_1$ are held fixed and coefficients of wavelets in $W_2$ are allowed to vary as agreement between the Fourier-space magnitude data and a Fourier-space representation of the estimate is sought, and g) providing the final estimate as an output.

In a preferred embodiment, iterative refinement of the estimate is performed by projecting the current estimate onto a Fourier-space representation having Fourier magnitudes that agree with the Fourier-space magnitude data, at points where the Fourier-space magnitude data exists (i.e., projecting onto set A as described above); and by projecting the current estimate onto a wavelet-space representation having the same basis wavelets as the initial estimate, and having coefficients $a_1$ for wavelets in $W_1$ (i.e., projecting onto set B as described above). These projections can be used to compute difference map iterations as described above. These methods are applicable to reconstructing images having any number of dimensions, including 2-D and 3-D images.

In a preferred embodiment, this approach for reconstructing images is applied to the task of comparing an object to a corresponding object description. The above-described real-space representation of the object is based on the object description. Incomplete Fourier magnitude data is obtained by performing diffraction measurement(s) on the object. From the real-space representation and Fourier space magnitude data, the image is reconstructed as described above. As a final step, the reconstructed image is compared to the object description, and results of this comparison are provided as an output. Objects and object descriptions can be 2-D or 3-D.

Figure 5:
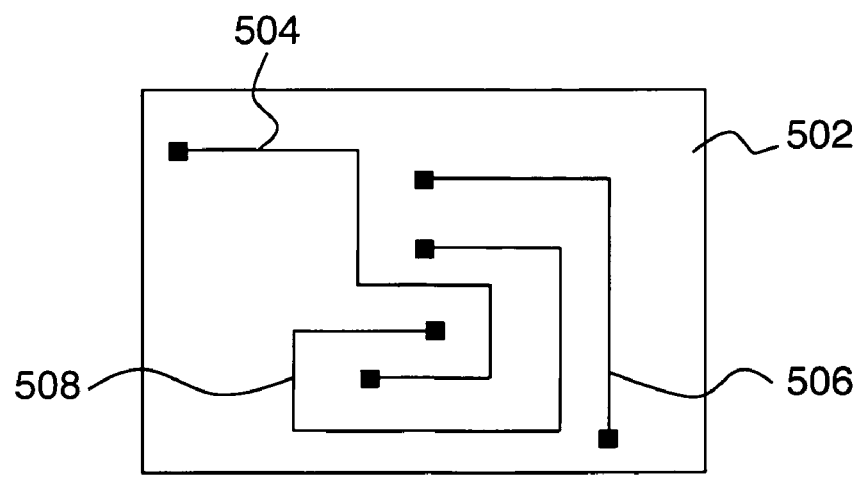
FIG. 5 shows an example of an integrated circuit pattern.
Figure 6:
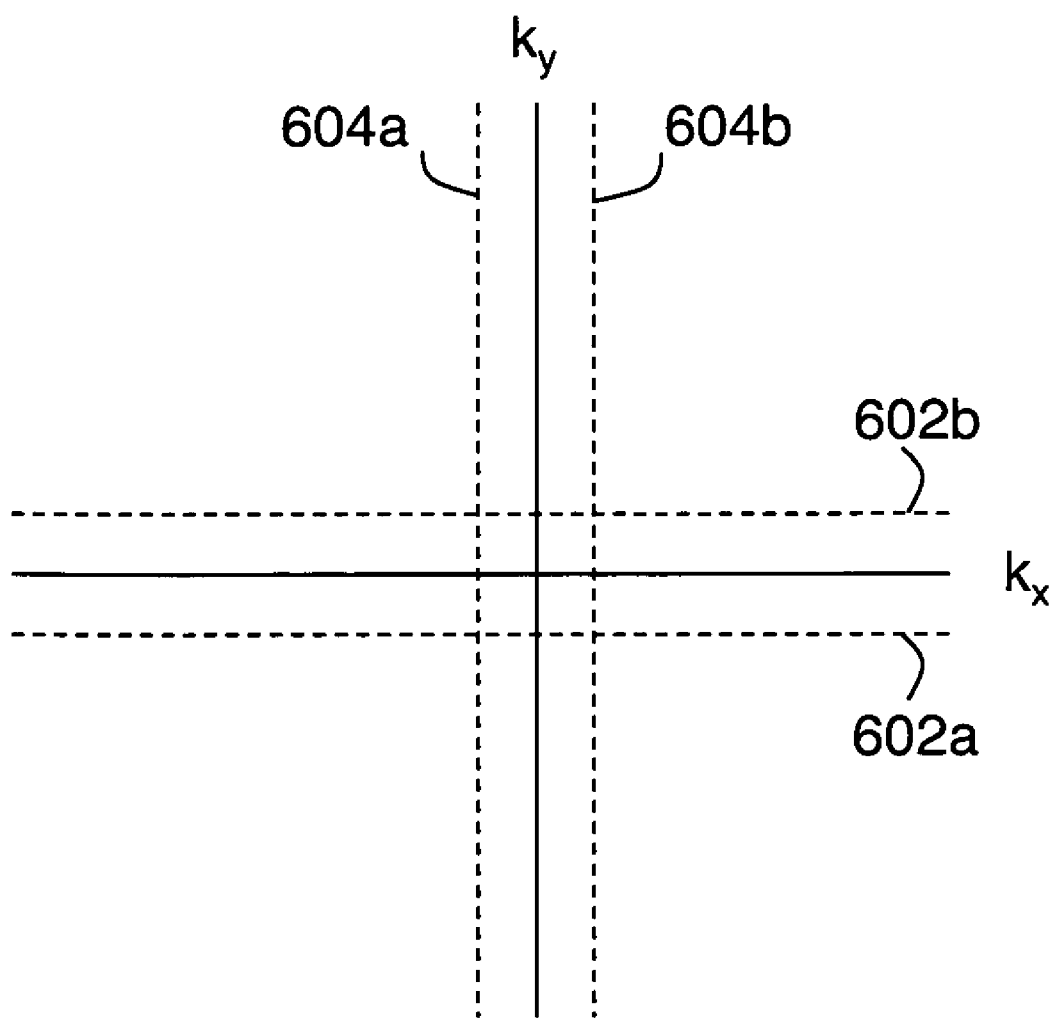
FIG. 6 shows some Fourier-space geometrical features corresponding to the example of FIG. 5.

For example, a schematic IC pattern is shown on FIG. 5, with traces 504, 506, and 508 on a circuit 502. As shown on FIG. 5, IC traces typically include horizontal and vertical segments, as opposed to segments at other angles. As a result, the Fourier-space representation of IC circuit patterns typically is concentrated at or near the Fourier space axes, provided these axes are aligned to the horizontal and vertical trace directions. Such alignment of the axes can easily be ensured, and is customary in practice. FIG. 6 shows some Fourier-space geometrical features relevant to this situation. Here lines 602a-b define a region of the Fourier plane close to the $k_x$ axis, while lines 604a-b define a region of the Fourier plane close to the ky axis. As indicated above, the 2-D diffraction pattern from a fabricated IC is concentrated at or near the Fourier-space axes (e.g., between lines 602a and 602b or between lines 604a and 604b).

For IC verification, it is preferred that the incomplete Fourier space magnitude data be the on-axis data. This dramatically reduces the amount of required diffraction data compared to full 2-D diffraction measurements. The concentration of the 2-D diffraction pattern at the Fourier-space axes makes this approach especially advantageous for IC verification, because data is taken only where the diffraction pattern is relatively intense, thereby increasing measurement accuracy.

The invention claimed is:

1. A method of comparing an object to a corresponding object description, the method comprising:
   a) providing a real-space representation R of said object based on said object description;
   b) providing substantially incomplete Fourier-space magnitude data of said object by performing a diffraction measurement on said object;
   c) computing a wavelet-space representation W of said real-space representation R;
   d) dividing basis wavelets of said wavelet-space representation into a first set $W_1$ having coefficients $a_1$ and a second set $W_2$ having coefficients $a_2$;
   e) computing a wavelet-space representation of an initial estimate;
   f) iteratively refining said estimate one or more times to provide a final estimate, wherein coefficients of wavelets in said set $W_1$ are held fixed and coefficients of wavelets in said set $W_2$ are allowed to vary as agreement between said Fourier-space magnitude data and a Fourier-space representation of said estimate is sought; and
   g) comparing said final estimate to said object description, and providing results of said comparison as an output.

2. The method of claim 1, wherein every wavelet in said set $W_1$ has a scale greater than or equal to the scale of any wavelet in said set $W_2$.

3. The method of claim 1, wherein said iteratively refining said estimate comprises:
   i) projecting said estimate onto a Fourier-space representation having Fourier magnitudes that agree with said Fourier-space magnitude data, at points where said Fourier-space magnitude data exists;
   ii) projecting said estimate onto a wavelet-space representation having the same basis wavelets as said wavelet-space representation W and having coefficients equal to said coefficients $a_1$ for wavelets in said set $W_1$; iii) repeating said steps (i) and (ii) in succession one or more times to provide said final estimate.

4. The method of claim 1, wherein said object and said object description are two-dimensional.

5. The method of claim 1, wherein said object and said object description are three-dimensional.

6. The method of claim 1, wherein said object is a fabricated integrated circuit, and wherein said object description is a design specification of said fabricated integrated circuit.

7. The method of claim 6, wherein said Fourier-space magnitude data is obtained along Fourier-space axes that correspond to real-space axes aligned with traces of said fabricated integrated circuit.

8. The method of claim 1, wherein said initial estimate is computed by setting said initial estimate equal to said representation W, except that coefficients of wavelets in said second set $W_2$ are set to zero.

* * * * *